United States Patent
Maruyama et al.

(10) Patent No.: US 6,933,657 B2
(45) Date of Patent: Aug. 23, 2005

(54) STACKED ELECTRO-MECHANICAL ENERGY CONVERSION ELEMENT AND METHOD OF MANUFACTURING THE SAME

(75) Inventors: Yutaka Maruyama, Tokyo (JP); Nobuyuki Kojima, Kanagawa (JP); Tooru Ezaki, Chiba (JP)

(73) Assignees: Canon Kabushiki Kaisha, Tokyo (JP); Taiheiyo Cement Corporation, Tokyo (JP)

( * ) Notice: Subject to any disclaimer, the term of this patent is extended or adjusted under 35 U.S.C. 154(b) by 506 days.

(21) Appl. No.: 10/102,730

(22) Filed: Mar. 22, 2002

(65) Prior Publication Data

US 2002/0149301 A1 Oct. 17, 2002

(30) Foreign Application Priority Data

Mar. 30, 2001 (JP) ........................................ 2001/099191
May 22, 2001 (JP) ........................................ 2001/152512

(51) Int. Cl.[7] .............................................. H01L 41/047
(52) U.S. Cl. ........................................ 310/328; 310/366
(58) Field of Search ................................. 310/328, 366

(56) References Cited

U.S. PATENT DOCUMENTS

| | | | | |
|---|---|---|---|---|
| 5,770,916 A | | 6/1998 | Ezaki et al. | ................. 310/366 |
| 5,814,919 A | * | 9/1998 | Okumura | ................ 310/323.12 |
| 5,936,327 A | * | 8/1999 | Takahashi et al. | ........... 310/366 |
| 6,046,526 A | | 4/2000 | Maruyama | .............. 310/323.06 |
| 6,065,196 A | * | 5/2000 | Inoi et al. | ................... 29/25.35 |
| 6,114,798 A | * | 9/2000 | Maruyama et al. | ..... 310/323.06 |
| 6,191,520 B1 | * | 2/2001 | Maruyama et al. | ..... 310/323.06 |
| 6,291,932 B1 | * | 9/2001 | Maruyama et al. | .......... 310/366 |

* cited by examiner

Primary Examiner—Thomas M. Dougherty
(74) Attorney, Agent, or Firm—Fitzpatrick, Cella, Harper & Scinto (57) ABSTRACT

A stacked electro-mechanical energy conversion element includes a plurality of layers having a circular shape each of which is formed of a material having an electro-mechanical energy conversion function and has a through-hole in the center thereof, a plurality of electrode portions formed at least on one surface of the layers and separated from each other by a plurality of first non-electrode portions, a plurality of wiring conductors which penetrate the plurality of layers and electrically connect electrode portions of the different layers, and a plurality of second non-electrode portions formed in the periphery of the wiring conductors so as to prevent the wiring conductors from being rendered conductive to the electrode portions, wherein the wiring conductors are formed at least on or in the vicinity of an edge of an outer diameter of each layer, and the electrode portions are formed over the edge of the outer diameter except for portions at which the second non-electrode portions are formed.

13 Claims, 11 Drawing Sheets

STACKED ELECTRO-MECHANICAL
ENERGY CONVERSION ELEMENT AND
METHOD OF MANUFACTURING THE SAME

BACKGROUND OF THE INVENTION

1. Field of the Invention

The present invention relates to a stacked electro-mechanical energy conversion element such as a piezoelectric element and a method of manufacturing the stacked electro-mechanical energy conversion element, and more particularly to a through-hole that forms a connection between the respective layers of the stacked electro-mechanical energy conversion element.

2. Related Background Art

Up to now, a piezoelectric material having an electro-mechanical energy conversion function is employed as various piezoelectric elements or piezoelectric devices. As a recent tendency, those piezoelectric elements and piezoelectric devices take not a single plate but a structure in which a large number of thin sheets are superimposed on each other so as to be stacked.

One main reason is that a large deformation or distortion or a large force can be obtained by a low supply voltage in a stacked piezoelectric element as compared with a single plate-like piezoelectric element. Also, another reason is that a sheet molding method or a manufacturing method for stacking have been spread, the thickness of each layer is thinned, and a stacked piezoelectric element and piezoelectric device which are downsized and high in performance are readily manufactured.

For example, a stacked piezoelectric element for a vibration wave motor which is an example of a vibration wave driving device has been disclosed by U.S. Pat. Nos. 6,046,526 and 5,770,916. The stacked piezoelectric element is not limited to a vibration wave driving device but employed for various devices such as a vibration gyro or a piezoelectric transformer.

The stacked electro-mechanical energy conversion element is of the structure in which a plurality of laminate materials each having an electro-mechanical energy conversion function on which an electrode region is formed are superimposed on each other. As a representative example, there is a structure in which a plurality of piezoelectric ceramics layers (hereinafter referred to as "piezoelectric layer") on a surface of which an electrode layer formed of an electrode material (hereinafter referred to as "inner electrode") is provided are stacked on each other.

As disclosed in U.S. Pat. Nos. 6,046,526 and 5,770,916, there is a structure that uses through-holes (or called "via holes") formed by embedding an electrically conductive material (electrode material) in holes defined in the piezoelectric layer as interlayer wirings for connecting a plurality of stacked inner electrodes.

Figure 10:
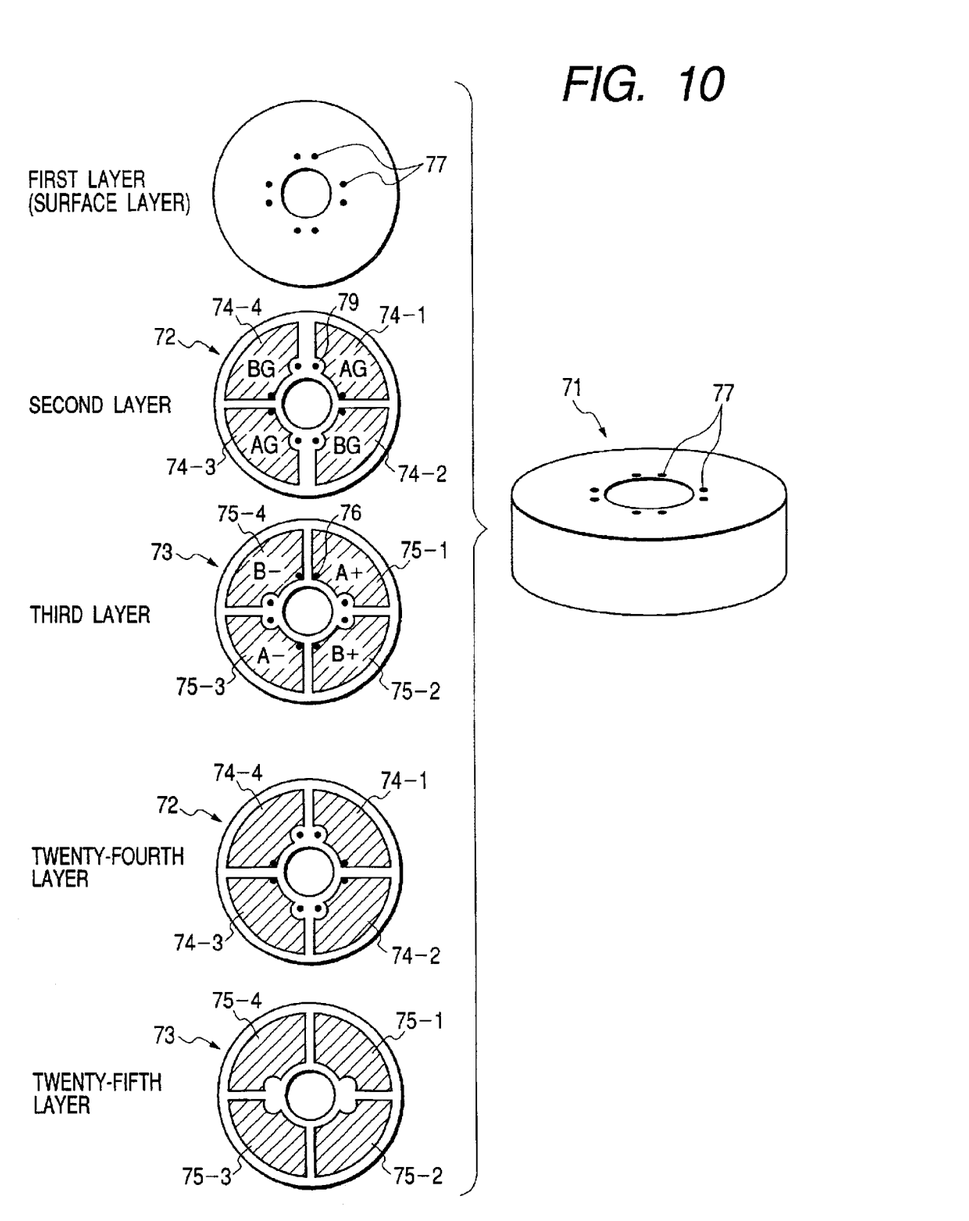
FIG. 10 is a perspective view and an exploded view showing a conventional stacked piezoelectric element.

FIG. 10 shows a stacked piezoelectric element disclosed in U.S. Pat. No. 5,770,916, in which a stacked piezoelectric element 71 has a through-hole 76 for connecting the inner electrodes.

In FIG. 10, the stacked piezoelectric element 71 is of a columnar shape in the center of which a through-hole is formed, in which through-holes 76 indicated by black circles are formed at an inner diameter side. The through-holes 76 render the respective stacked piezoelectric layers conductive. On the surfaces of two kinds of piezoelectric layers 72 and 73 that constitute the stacked piezoelectric element 71 are formed an inner electrode (or called "electrode pattern") 74 divided into four electrode portions (74-1, 74-2, 74-3, 74-4) and an inner electrode 75 divided into four electrode portions (75-1, 75-2, 75-3, 75-4). The piezoelectric layers 72 and 73 are alternately stacked on each other on a second layer to a twenty-fifth layer except for a first layer that is an upper surface layer.

Eight through-holes 76 indicated by black circles are formed at the inner diameter sides of the respective piezoelectric layers in the figure. Among them, four through-holes 76 render the electrode portions positioned at an inphase of the second layer, the fourth layer, the sixth layer, . . . the 24th layer (piezoelectric layer 72) conductive to each other.

Also, the remaining four through-holes 76 render the electrode portions positioned at an inphase of the third layer, the fifth layer, the seventh layer, . . . the 25th layer (piezoelectric layer 73) conductive to each other. Only the 25th layer is different in structure from other layers in that no through-holes are formed in the 25th layer because no layer is disposed below the 25th layer.

Also, the through-holes that are rendered conductive to the inner electrode 74 of the piezoelectric layer 72 are not rendered conductive to the inner electrode 75 of the piezoelectric layer 73 whereas the through-holes that are rendered conductive to the inner electrode 75 of the piezoelectric layer 73 are not rendered conductive to the inner electrode 74 of the piezoelectric layer 72.

Then, those eight through-holes 76 are rendered nonconductive to each other, and the end portions of the through-holes 76 are exposed on the surface of the stacked piezoelectric element 71 to form a surface electrode 77. Also, the respective inner electrodes 74 and 75 are not formed up to the edges of the outer diameter and the inner diameter, and non-electrode regions are formed at the edges of the outer diameter and the inner diameter.

The stacked piezoelectric element 71 thus structured as shown in FIG. 10 is subjected to the following polarizing process.

In the respective piezoelectric layers 73 that structure the third layer, the fifth layer, the seventh layer, . . . the 25th layer, the electrode portions having a positional relationship of 180 degrees have polarized polarities different from each other so that the electrode portions 75-1 and 75-3 are polarized to +(plus) and −(minus), respectively, and the electrode portions 75-2 and 75-4 are polarized to +(plus) and −(minus), respectively.

As shown in FIG. 10, it is assumed that the electrode portions 75-1 and 75-3 are A+ and A− respectively, the electrode portions 75-2 and 75-4 are B+ and B− respectively, and those electrode portions are phase A and phase B, respectively. Also, it is assumed that the electrode portions 74-1 and 74-3 of the piezoelectric layer 72 which face the electrode portions 75-1 and 75-3 are a phase AG, the electrode portions 74-2 and 74-4 of the piezoelectric layer 72 which face the electrode portions 75-2 and 75-4 are a phase BG, and those electrode portions are electrically grounded.

Figure 11:
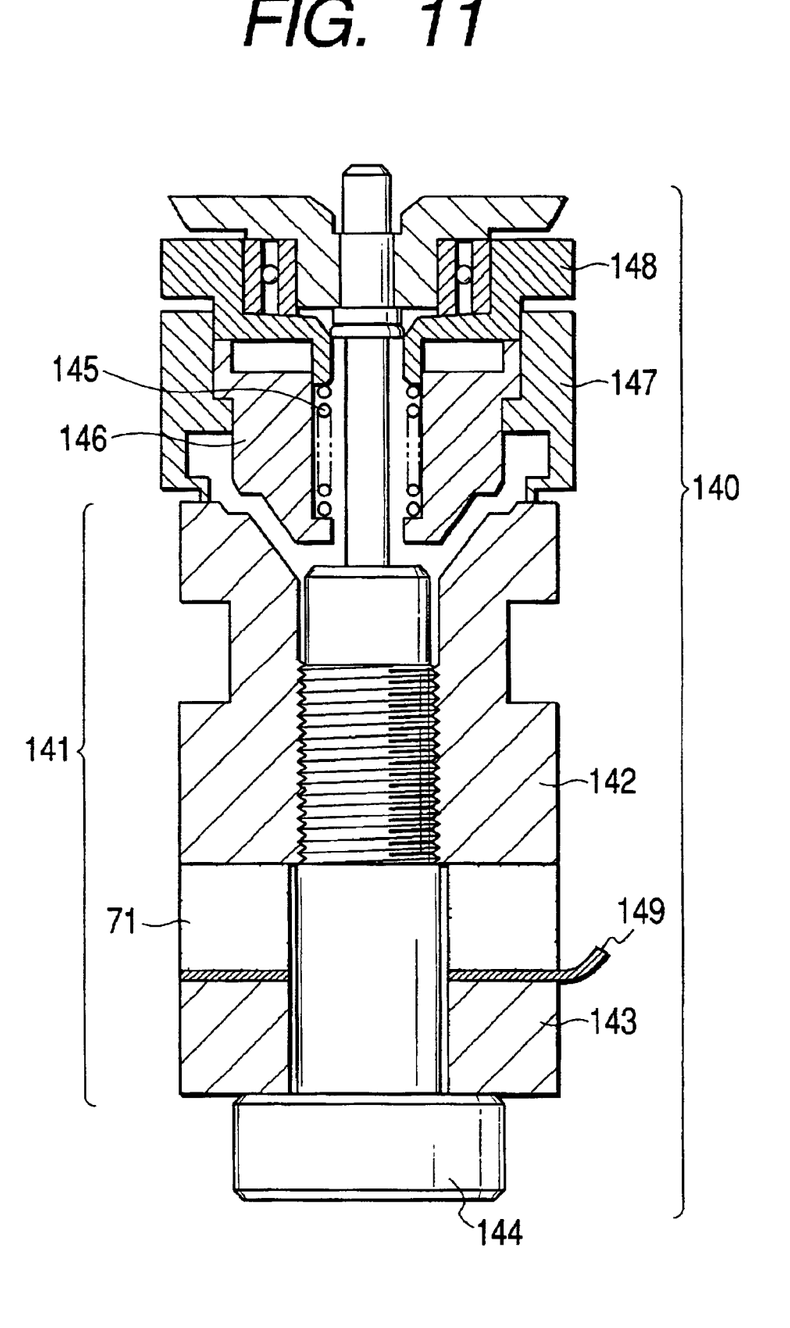
FIG. 11 is a cross-sectional view showing a vibration wave motor in which the stacked piezoelectric element shown in FIG. 10 is incorporated.

FIG. 11 is a cross-sectional view showing a bar-shaped vibration wave motor 140 that functions as a vibration wave driving device where the stacked piezoelectric element 71 are incorporated in a vibration member 141. The stacked piezoelectric element 71 and a wiring board 149 that comes in direct contact with the stacked piezoelectric element 71 are disposed between metal parts 142 and 143 which are elastic members of the vibration member 141 are fixed by fastening a bolt 144. The eight surface electrodes of the stacked piezoelectric element 71 and the electrode pattern of the wiring substrate 149 are electrically connected to each other.

The drive principle of the bar-shaped vibration wave motor 140 is as follows: two bending vibrations that are orthogonal to each other are produced in the vibration member 141 in which the stacked piezoelectric element 71 is incorporated, and a rotor 147 that comes in pressure contact with the vibration member 141 is driven by a frictional force. The rotor 147 is brought in pressure contact with the metal part 142 though a spring 145 and a spring support member 146.

The phase AG and the phase BG which face the phase A and the phase B are grounded, and a high frequency voltage that is substantially identical with a natural vibration frequency is applied to the phase A. Also, a high frequency voltage of the same vibration frequency as that of the phase A but electrically different in phase from the phase A by 90 degrees is applied to the phase B that is spatially different in phase from the phase A by 90 degrees, and drive vibrations are obtained by synthesizing those two bending vibrations produced in the vibration member 141.

Then, the rotor 147 that is in pressure contact with one surface of the metal part 142 is frictionally driven by the drive vibrations generated in the vibration member 141, and a drive force is outputted from the gear 148 that functions as an output member that rotates integrally with the rotor 147.

It is necessary to notch the inner electrode 75 and dispose an insulating portion (non-electrode region 79 in FIG. 10) in the periphery of the through-hole so that the through-hole that is rendered conductive to the inner electrode 74 of the piezoelectric layer 72 is not rendered conductive to the inner electrode 75 of the piezoelectric layer 73. The same is applied to the piezoelectric layer 72.

When the outer diameter of the stacked piezoelectric element is made small as the through-holes remain at the inner diameter side as in the stacked piezoelectric element shown in FIG. 10, because the circular insulating portion is disposed in the periphery of the through-hole, it is difficult to satisfactorily broaden a region of a piezoelectric active portion (a portion interposed between the inner electrode 74 and the inner electrode 75) necessary to drive the vibration wave motor. For that reason, there is a limit of downsizing the stacked piezoelectric element 71.

SUMMARY OF THE INVENTION

The present invention has been made in view of the above-mentioned related art, and therefore an object of the present invention is to provide a stacked piezoelectric element that is suitable for downsizing by the provision of a broad piezoelectric active portion.

According to an aspect of the present invention, there is provided a stacked electro-mechanical energy conversion element having a plurality of electrode portions on a surface thereof, and a plurality of layers each having an electro-mechanical energy conversion function in which wiring conductors (through-holes) that penetrate the plurality of layers and electrically connect the electrode portions of the different layers is formed, wherein the wiring conductors are formed at the end portions of the layers or in the vicinity of the end portions.

Preferably, each of the plurality of layers is shaped into a circle having a through-hole in the center thereof, and a non-electrode portion for preventing the conduction of each of the wiring conductors and each of the plurality of electrode portions is formed, and the electrode portions are formed over an outer diameter edge or an inner diameter edge except for a portion on which the non-electrode is formed.

Other features and advantages of the present invention will be apparent from the following description taken in conjunction with the accompanying drawings, in which like reference characters designate the same or similar parts throughout the figures thereof.

DESCRIPTION OF THE PREFERRED EMBODIMENTS

Now, a description will be given in more detail of preferred embodiments of the present invention with reference to the accompanying drawings.

Figure 1:
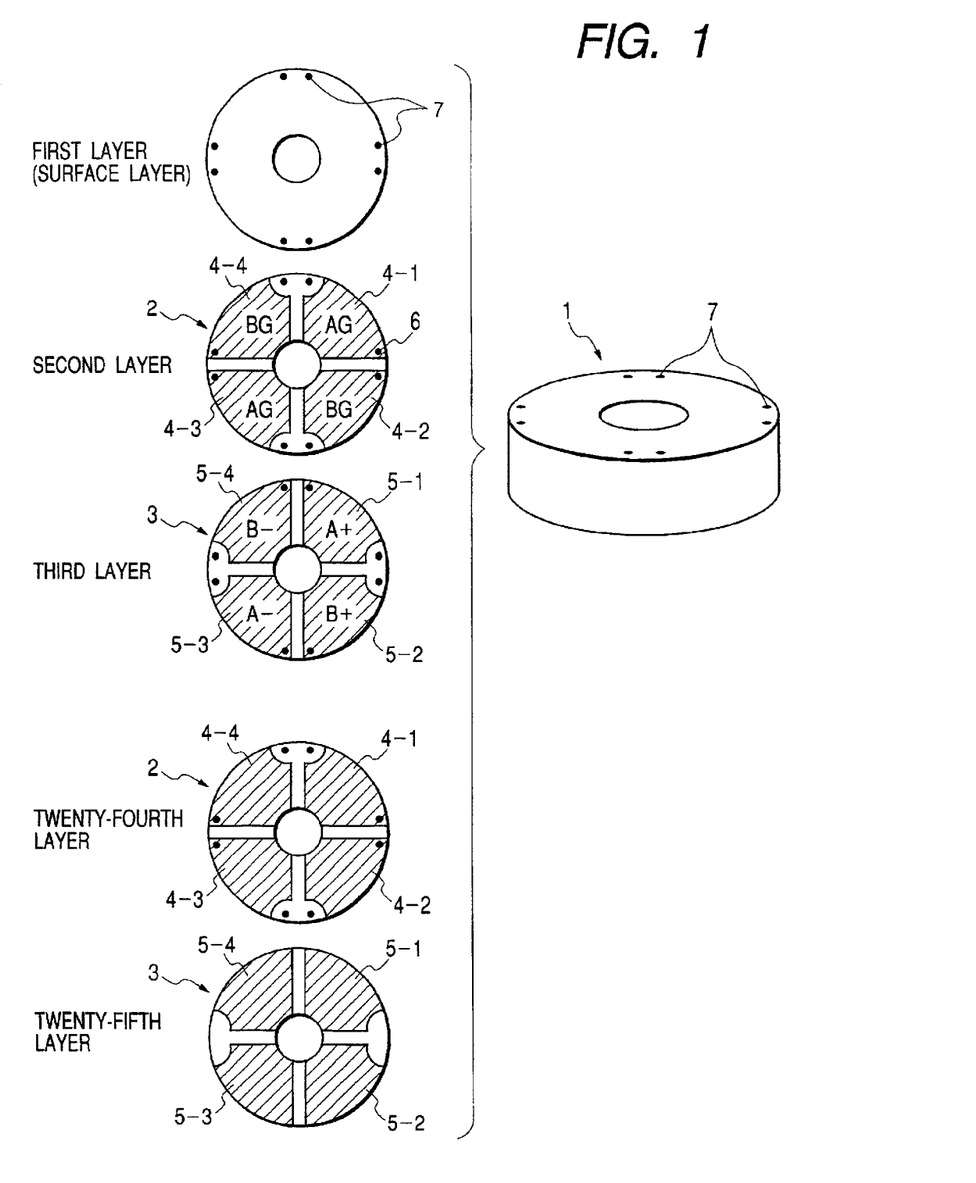
FIG. 1 is a perspective view and an exploded view showing a stacked piezoelectric element in accordance with a first embodiment of the present invention.

FIG. 1 shows a first embodiment of the present invention.

A stacked piezoelectric element 1 that functions as a stacked electro-mechanical energy conversion element according to this embodiment is designed such that through-holes are formed in the center thereof to obtain conductions between stacked piezoelectric layers.

As a second layer to a 25th layer except for a first layer that is a surface layer (uppermost layer), piezoelectric layers 2 and 3 are alternately disposed one by one. That is, the stacked piezoelectric element 1 includes the piezoelectric layers 2 that form the second layer, the fourth layer, the sixth layer, . . . , and the 24th layer, and the piezoelectric layers 3 that form the third layer, the fifth layer, the seventh layer, . . . , and the 25th layer. Then, inner electrodes 4 and 5 disposed on the surfaces of the respective piezoelectric layers 2 and 3 reach the edges of the outer diameters and the inner diameters of disc-shaped piezoelectric bodies that constitute the respective layers.

A cross-shaped slit (non-electrode formation portion) that passes through diameter portions is formed on a surface of each of two kinds of piezoelectric layers 2 and 3 that constitute the stacked piezoelectric element 1. Through the slits, the inner electrode 4 is divided into four segments consisting of electrode portions 4-1, 4-2, 4-3 and 4-4, and the inner electrode 5 is divided into four segments consisting of electrode portions 5-1, 5-2, 5-3 and 5-4.

In the piezoelectric layers 2 and the piezoelectric layers 3, eight through-holes 6 indicated by black circles in the figure are formed at positions that approach the outer diameter ends as much as possible, respectively.

The respective piezoelectric layers are stacked so that all of eight through-holes 6 are inphase with each other, and the respective through-holes 6 are coupled to each other in a thickness direction of the stacked piezoelectric element to render the respective piezoelectric layers conductive.

Each of the electrode portions of the piezoelectric layers 2 and the piezoelectric layers 3 has one through-hole formed therein so that the electrode portions of the piezoelectric layers 2 which are positioned in the same phase are rendered conductive, and the electrode portions of the piezoelectric layers 3 which are positioned in the same phase are rendered conductive. In this situation, each of the through-holes that pass through the electrode portions of the piezoelectric layers 2 passes through each of the non-electrode portions of the piezoelectric layers 3, and each of the through-holes that pass through the electrode portions of the piezoelectric layers 3 passes through each of the non-electrode portions of the piezoelectric layers 2.

In other words, when those through-holes are viewed as eight linear through holes coupled to each other in the thickness direction of the piezoelectric elements, each one of those eight linear through-holes alternately passes through the electrode portions and the non-electrode portion.

Since the 25th layer is a lowermost layer and no layer is disposed below the 25th layer, no through-holes are formed in the 25th layer.

Those eight linear through-holes 6 are out of contact with each other and are not rendered conductive to each other. Also, the respective end portions of those eight through-holes 6 are exposed to the surface of the stacked piezoelectric element 1, and the eight surface electrodes 7 that are identical in size with the diameters of the through-holes are formed on the first layer.

After the stacked piezoelectric element 1 has been structured as described above, the stacked piezoelectric element 1 is subjected to the following polarizing process as in the related art so as to be given polarization polarity suitable for the vibration wave motor.

In the piezoelectric layers 3 that constitute the third layer, the fifth layer, the seventh layer, . . . , and the 25th layer of the stacked piezoelectric element 1, the electrode portion 5-1 and the electrode portion 5-3 are polarized to +(plus) and −(minus), and the electrode portion 5-2 and the electrode portion 5-4 are polarized to +(plus) and −(minus), respectively, so that the electrode portions having a positional relationship of 180 degrees have polarization polarities different from each other.

That is, as shown in FIG. 1, assuming that the electrode portions 5-1 and 5-3 are set to A+ and A−, and the electrode portions 5-2 and 5-4 are set to B+ and B−, those electrode portions are set to a phase A and a phase B. The electrode portions 4-1 and 4-3 of the piezoelectric layer 2 which face the electrode portions 5-1 and 5-3 are set to a phase AG, the electrode portions 4-2 and 4-4 of the piezoelectric layer 2 which face the electrode portions 5-2 and 5-4 are set to a phase BG, and those electrode portions are electrically grounded.

Figure 3:
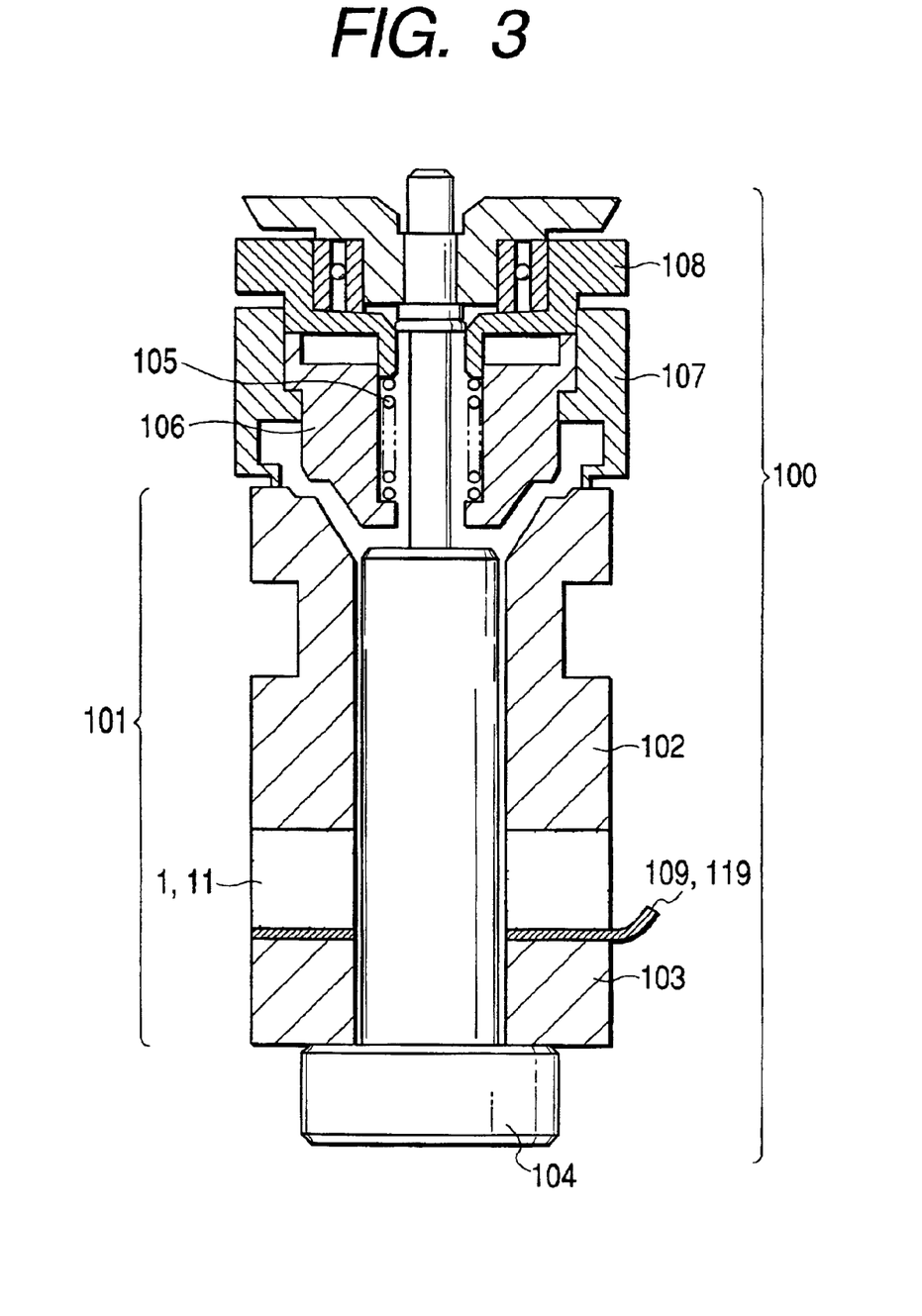
FIG. 3 is a cross-sectional view showing a vibration wave motor in which the stacked piezoelectric element shown in FIGS. 1 and 2 is incorporated.

FIG. 3 is a diagram showing a structure in which the stacked piezoelectric element 1 is incorporated in a vibration member 101 that constitutes the bar-shaped vibration wave motor 100. The vibration member 101 is set to be smaller in diameter than the conventional one.

The stacked piezoelectric element 1 and a wiring substrate 109 are disposed between the metal parts 102 and 103 which are elastic members of the member 101, and fitted by fastening a bolt 104. The wiring substrate 109 comes in close contact with the stacked piezoelectric element 1 by a nipping force exerted at this time. The rotor 107 comes in pressure contact with the metal part 102 through the spring 105 and the spring support member 106.

The wiring substrate 109 is disposed with a wiring electrode pattern which is rendered conductive to the respective surface electrodes 7 of the stacked piezoelectric element 1 to electrically connect an external power supply and the stacked piezoelectric element 1.

The wiring substrate 109 is structured by patterning a copper foil which is 35 $\mu$m in thickness for wiring on a normally used sheet made of polyimide which is 25 $\mu$m in thickness.

Then, as in the conventional example, the phase AG and the phase BG that face the phase A and the phase B are grounded, a high-frequency voltage that is substantially identical with the natural vibration frequency of the vibration member is applied to the phase A, and a high frequency voltage of the same vibration frequency which is electrically different in phase from the phase A by 90 degrees is applied to the phase B spatially different in phase from the phase A by 90 degrees. In this way, in the drive vibration obtained by synthesizing two bending vibrations of the vibration member 101, the rotor 107 that is in pressure contact with one surface of the metal part 102 that is an elastic member is frictionally driven, and a driving force is outputted from the gear 108 that functions as an output member that rotates integrally with the rotor 107.

The above-mentioned conventional stacked piezoelectric element 71 is 10 mm in outer diameter, 2.8 mm in inner diameter, 2.3 mm in thickness, about 90 $\mu$m in the thickness of the piezoelectric layer, 2 to 3 $\mu$m in the thickness of the inner electrode, and 25 in the total number of piezoelectric layers.

On the contrary, the stacked piezoelectric element 1 according to this embodiment is 6 mm in outer diameter, 1.7 mm in inner diameter, about 1.6 mm in thickness, about 60 $\mu$m in the thickness of the piezoelectric layer, 2 to 3 $\mu$m in the thickness of the inner electrode, 25 in the total number of piezoelectric layers, and 24 in the number of layers having inner electrode. Also, the diameter of the through-holes is 0.1 mm. The outer diameter of the metal parts 22 and 24 which are elastic members are also 6 mm which is the same as that of the stacked piezoelectric element 1.

The stacked piezoelectric element 1 according to this embodiment is smaller in the outer diameter than the conventional stacked piezoelectric element 71, and the thickness of each of the layers is also thinned.

A method of manufacturing a stacked piezoelectric element according to this embodiment will be described. Silver and palladium powder paste are screen-printed on a green sheet made of piezoelectric ceramic powders that will form the piezoelectric layer and organic binder to form an inner electrode. Subsequently, silver and palladium powders are filled in the through hole portions, and the respective sheets are superimposed on each other and pressurized while being heated so as to be stacked. Then, a hole is penetrated in the center of the stacked sheets by machining to form an inner diameter portion before being sintered. Thereafter, after the stacked sheets are sintered at about 1100° C. in a lead atmosphere and subjected to sintering and polarizing processes, a both-surface lapping process is conducted on the stacked sheets, and the outer diameter portion is finally adjusted by a mechanical (cutting) process.

In the existing circumstances, because a positional precision of the through-holes with respect to the outer diameter in the manufacture is finally ±0.1 mm after machining, in this embodiment, the through-holes are so formed as to be set to 0.25 mm inwardly from the edge of the outer diameter. Under this condition, there is no case in which no through-holes are formed in the outer peripheral portion with the margin of 0.1 mm at the minimum.

In order to reduce an area of the insulating portion in the periphery of the through-hole as much as possible, the through-hole is allowed to approach the edge of the outer diameter as much as possible. Also, the insulating portion (non-electrode portion) in the periphery of each the through-hole includes the outer diameter edge and a slit so as to be shaped into a fan which is substantially ¼ of a circle. In this embodiment, each the through-hole is in the vicinity of the slit, but if the through-hole is formed at a position apart from the slit, it is desirable that the insulating portion in the periphery of the through-hole is shaped into a substantially semi-circle including the edge of the outer diameter. The radius of the insulating portion from the center of the through-hole is set to about 0.5 mm, and the slit that divides a plurality of electrode layers is set to about 0.4 mm.

Those values are dimensions by which the insulation is surely taken in use, and are determined taking into consideration the positional displacements of the respective electrode portions of the stacked piezoelectric element and the through-holes in the manufacture, the use conditions and so on. If an improvement of the manufacturing technique is advanced, the stacked piezoelectric element 1 can be further reduced.

In the stacked piezoelectric element 1 according to this embodiment, the through-holes 6 and the surface electrodes 7 are made to extremely approach the outer diameter end side of the element, to thereby reduce an area of the insulating portion around each the through-hole. In addition, each the inner electrode is extended up to a region ranging from the outer diameter portion to the inner diameter portion (a region indicated by hatching in FIG. 1). With this structure, the area of the piezoelectric active portion of the stacked piezoelectric element 1 can be enlarged as compared with the conventional one.

As a result, the rotation speed of the vibration wave motor, the rotating torque or the drive efficiency can be improved. That is, the vibration wave motor can be more downsized with the similar level in performance.

Figure 2:
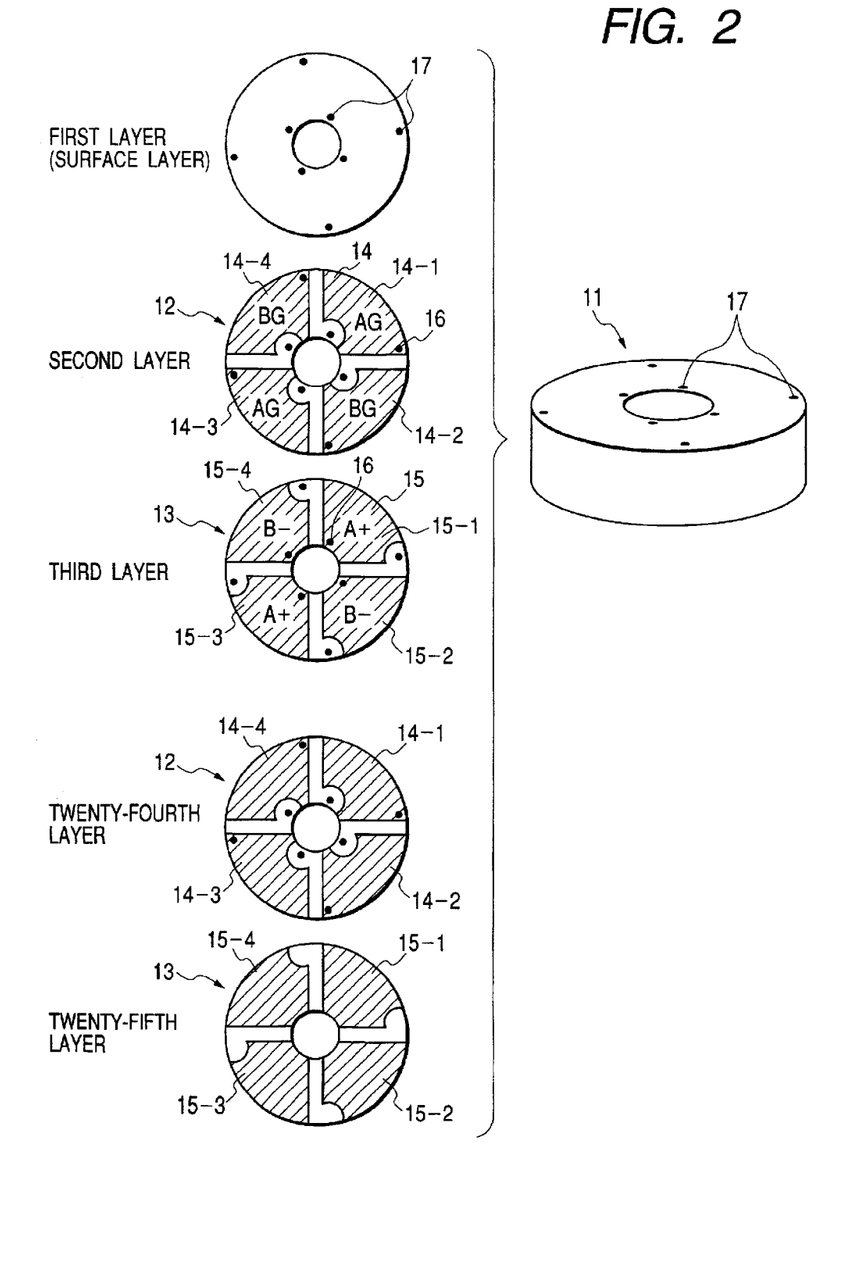
FIG. 2 is a perspective view and an exploded view showing a stacked piezoelectric element in accordance with a second embodiment of the present invention.

FIG. 2 shows a second embodiment of the present invention.

The stacked piezoelectric element 11 according to this embodiment is different from that shown in FIG. 1 in that the through-holes 16 are formed in four in the vicinity of the inner diameter and the outer diameter, respectively. The method of manufacturing the stacked piezoelectric element 11 and the driving method are identical with those of the stacked piezoelectric element 1 shown in FIG. 1.

In the second layer to the 25th layer except for the first layer that is a surface layer, piezoelectric layers 12 and 13 are alternately disposed one by one. A cross-shaped slit (non-electrode formation portion) that passes through diameter portions is formed on a surface of each of the piezoelectric layers 12 and 13. Through the slits, the inner electrode 14 is divided into four segments consisting of electrode portions 14-1, 14-2, 14-3 and 14-4 by the slit, and the inner electrode 15 is divided into four segments consisting of electrode portions 15-1, 15-2, 15-3 and 15-4. Those electrode portions reach the edges of the outer diameter and the inner diameter of the disc-shaped piezoelectric member.

Through-holes 16 indicated by black circles in the figure are formed extremely in the vicinity of the outer diameter and the inner diameter of each piezoelectric layer. In this embodiment, all of the dimensions of the stacked piezoelectric element are identical with the stacked piezoelectric element 1 shown in FIG. 1 except for the positions at which the through-holes are formed, and the through-holes 16 are formed such that the inner side of the outer diameter is 0.25 mm and the outer side of the inner diameter is 0.25 mm. With this dimensions, the through-holes are not exposed to the outer periphery thereof. Then, each of the insulating portions (non-electrode portion) is made to approach the edge of the outer diameter or the inner diameter as much as possible so as to be shaped into a substantially semicircle with the through-hole used as its center, to thereby reduce the area of the insulating portion as much as possible.

In the piezoelectric layers 12 that constitute the second layer, the fourth layer, the sixth layer, . . . , and the 24th layer, each of the through-holes 16 formed in the vicinity of the outer diameter passes through the electrode portion, and each of the through-holes 16 formed in the vicinity of the inner diameter passes through the non-electrode portion. In the piezoelectric layers 13 that constitute the third layer, the fifth layer, the seventh layer, . . . , and the 25th layer, each of the through-holes 16 formed in the vicinity of the inner diameter passes through the electrode portion, and each of the through-holes 16 formed in the vicinity of the outer diameter passes through the non-electrode portion. Since the 25th layer is a lowermost layer and no layer is disposed below the 25th layer, no through-hole 16 is disposed.

FIG. 3 is a diagram in which the stacked piezoelectric element 11 is incorporated in the vibration member 101 that constitutes the bar-shaped vibration wave motor 100. The stacked piezoelectric element 11 and a wiring substrate 119 are disposed between the metal parts 102 and 103 which are elastic members of the vibration member 101, and fitted by fastening a bolt 104. The wiring substrate 119 comes in close contact with the stacked piezoelectric element 1 by a nipping force exerted at this time. The rotor 107 comes in pressure contact with the metal part 102 through the spring 105 and the spring support member 106.

The stacked piezoelectric element 11 shown in FIG. 2 has the through-holes on the inner diameter portions which is different from that of FIG. 1. This structure has such an advantage that a plurality of through-holes are dispersed toward the outer diameter side and the inner diameter side with the result that a margin can be provided in the space of the wiring electrode pattern of the wiring substrate 119 to simplify the design. This advantage in the actual use is significant in the development of a compact vibration wave motor. Moreover, the same performance as that of the stacked piezoelectric element 1 shown in FIG. 1 is provided as the driving source of the vibration wave motor.

Figure 4:
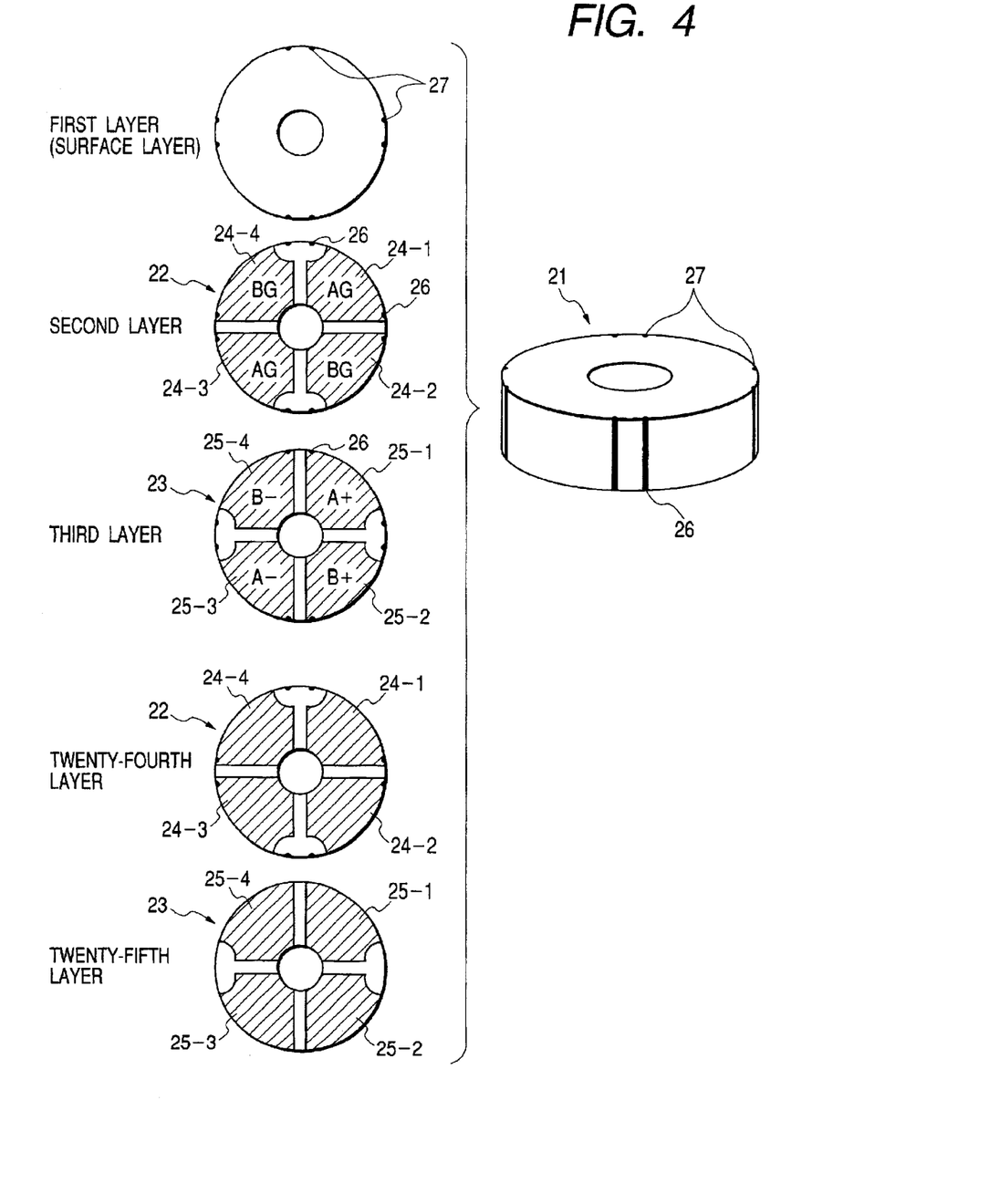
FIG. 4 is a perspective view and an exploded view showing a stacked piezoelectric element in accordance with a third embodiment of the present invention.

FIG. 4 is a third embodiment of the present invention.

A stacked piezoelectric element according to this embodiment is different from that shown in FIG. 1 in the positions at which the through-holes are formed. The through-holes of the stacked piezoelectric element 1 shown in FIG. 1 are formed in the vicinity of the outer diameter of the stacked piezoelectric element 1, but the through-holes 26 of the stacked piezoelectric element 21 according to this embodiment are formed on the outer diameter end of the stacked piezoelectric element 21.

The above-mentioned conventional stacked piezoelectric element is 10 mm in outer diameter, 2.8 mm in inner diameter, about 2.3 mm in thickness, about 90 $\mu$m in the thickness of the piezoelectric layer, 2 to 3 $\mu$m in the thickness of the inner electrode, and 25 in the total number of piezoelectric layers.

The stacked piezoelectric element 21 according to this embodiment is specifically 6 mm in outer diameter, 1.7 mm in inner diameter, about 1.6 mm in thickness, about 60 $\mu$m in the thickness of the piezoelectric layer, 2 to 3 $\mu$m in the thickness of the inner electrode, 25 in the total number of piezoelectric layers, and 24 in the number of inner electrode layers. Also, the diameter of the through-holes is 0.35 mm. The outer diameter of the metal parts 22 and 23 which are elastic members are also 6 mm which is the same as that of the stacked piezoelectric element 21.

The stacked piezoelectric element 21 according to this embodiment is smaller in the outer diameter than the conventional stacked piezoelectric element 71, and the thickness of each of the layers is also thinned.

However, a difference in the rotation speed of the vibration wave motor and the rotary torque hardly occurs between the vibration wave motor 140 in which the stacked piezoelectric element 71 is incorporated and the vibration wave motor in which the stacked piezoelectric element 21 is incorporated.

A method of manufacturing the stacked piezoelectric element according to this embodiment will be described. Holes for forming the through-holes are pierced in a green sheet made of piezoelectric ceramic-powders which will form the piezoelectric layer and organic binder, and silver and palladium powder paste are filled in the holes. Then, silver and palladium powder paste which will form the inner electrode are screen-printed on the green sheet, and the respective sheets are superimposed on each other and pressurized while being heated so as to be stacked. Then, a hole is penetrated in the center of the stacked sheets by machining to form an inner diameter portion before being sintered. Thereafter, after the stacked sheets are sintered at about 1100 C in a lead atmosphere and subjected to sintering and polarizing processes, a both-surface lapping process is conducted on the stacked sheets, and the outer diameter portion is finally adjusted by a mechanical (cutting) process.

A plurality of piezoelectric layers are obtained from one large green sheet. For example, one green sheet that is formed into a rectangle is folded so as to be superimposed on each other and sintered. After being sintered, the sheet is machined into a circular outer configuration by machining.

Figure 9A:
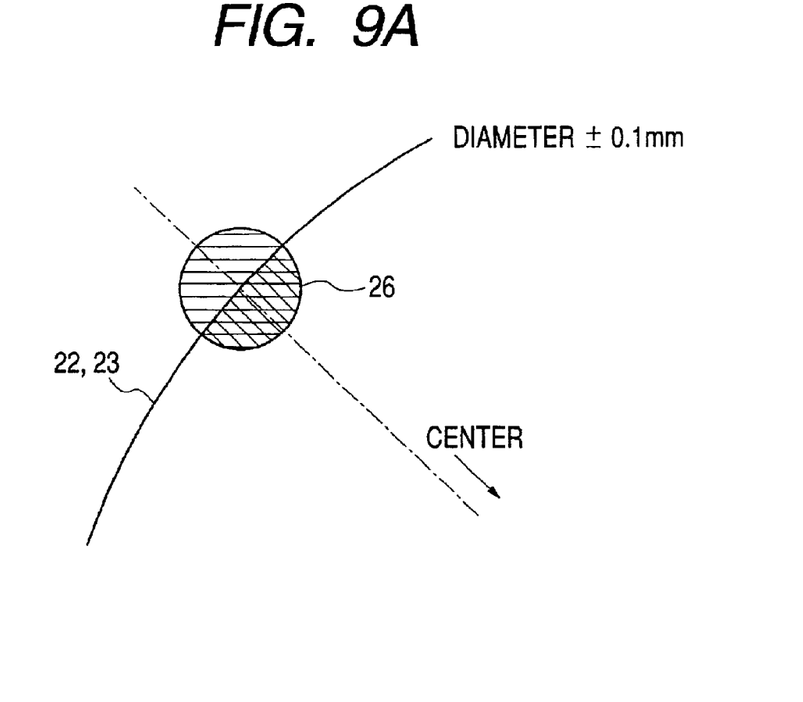
FIGS. 9A and 9B are diagrams showing a method of forming a through-hole.

In a completed product of the stacked piezoelectric element 21, the through-holes 26 are shaped into a semicircle at the outer diameter ends of the piezoelectric layers 22 and 23. However, in a state of the through-holes 26 before sintering, as shown in FIG. 9A, each of the through-holes 26 is formed in a circle (0.35 mm in diameter before sintering) indicated by oblique lines with a position that forms the outer diameter end as a center. That is because in a final process of manufacturing the stacked piezoelectric element 21, while the outer diameter of the stacked piezoelectric element 21 is formed in a circle by machining, parts of the through-holes 26 are cut and the through-holes are formed in a substantially semicircle indicated by dual oblique lines in FIG. 9A.

In this embodiment, the through-holes are formed at the outer diameter end. In the existing circumstances, because a positional precision of the through-holes with respect to the outer diameter in the manufacture is finally ±0.1 mm after machining, the diameter of the through-holes is set to be slightly larger, that is, 0.35 mm so that the filler within the through-holes is prevented from being scrapped off.

Also, the radius of the insulating portion which is formed into a substantially ¼ circle in the periphery of the through-hole is set to be about 0.6 mm from the through-hole on the outer diameter, and the slit that divides the electrode layer is set to be about 0.4 mm.

Those values are dimensions by which the insulation is surely taken in use as in the first embodiment, and are determined taking into consideration the positional displacements of the respective electrode portions of the stacked piezoelectric element and the through-holes in the manufacture, the use conditions and so on. If an improvement of the manufacturing technique is advanced, the stacked piezoelectric element 21 can be further reduced.

Figure 5:
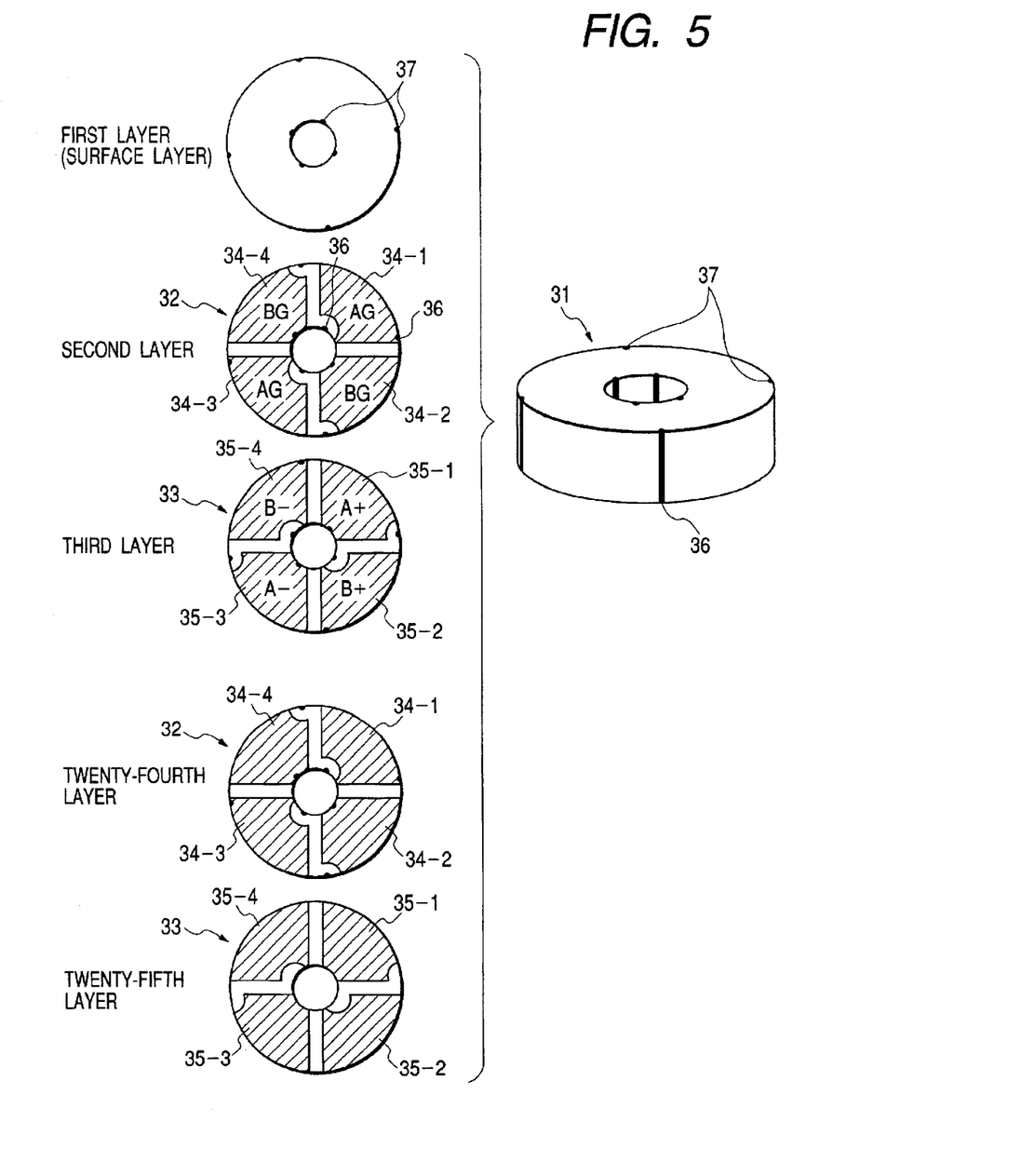
FIG. 5 is a perspective view and an exploded view showing a stacked piezoelectric element in accordance with a fourth embodiment of the present invention.

FIG. 5 shows a fourth embodiment of the present invention.

A stacked piezoelectric element shown in FIG. 5 is different from the stacked piezoelectric element 11 shown in FIG. 2 in the positions at which the through-holes are formed. The through-holes of the stacked piezoelectric element 11 shown in FIG. 2 are formed in the vicinity of the inner diameter and in the vicinity of the outer diameter of the stacked piezoelectric element 11, but the through-holes 36 of the stacked piezoelectric element 31 according to this embodiment are formed on the inner diameter end and the outer diameter end of the stacked piezoelectric element 31.

The method of manufacturing the stacked piezoelectric element 31 is identical with that in the third embodiment.

In the embodiment shown in FIG. 5, the through-holes which become shaped in a substantially semicircle are formed on the inner diameter end and the outer diameter end, respectively. However, all of the through-holes may be disposed on the inner diameter end side. However, as described above, the periphery of the inner diameter becomes smaller in area because of downsizing, to thereby make it difficult to design the wiring electrode pattern on the wiring substrate. Therefore, it is preferable that the through-holes are formed on the outer diameter, or dispersed on the outer diameter and the inner diameter. Similarly, in this embodiment, the stacked piezoelectric element 31 having the same dimensions as those of the stacked piezoelectric element 21 shown in FIG. 4 is manufactured.

Figure 6:
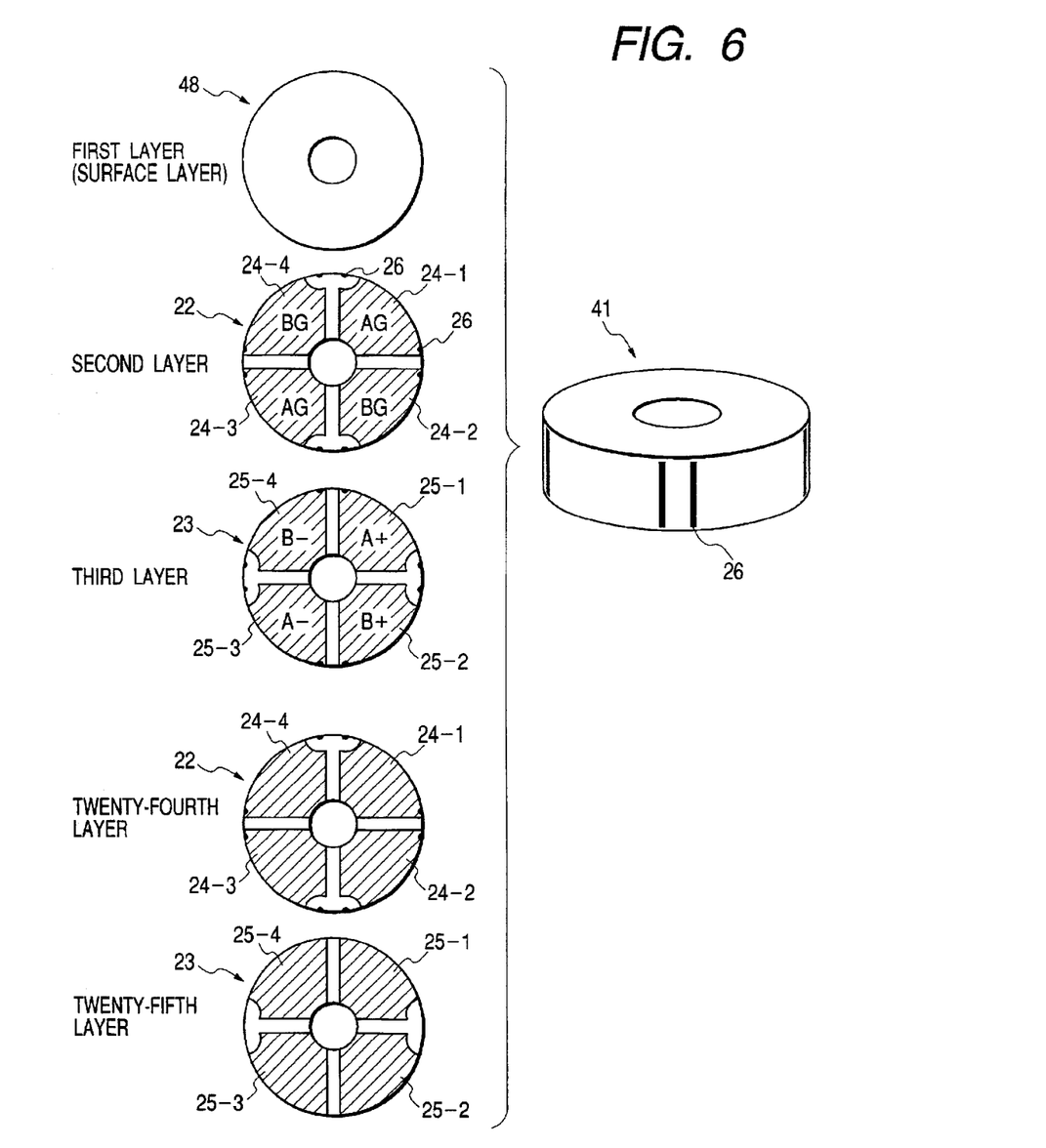
FIG. 6 is a perspective view and an exploded view showing a stacked piezoelectric element in accordance with a fifth embodiment of the present invention.

FIG. 6 shows a fifth embodiment of the present invention.

A stacked piezoelectric element 41 according to this embodiment is identical with the stacked piezoelectric element 21 according to the third embodiment shown in FIG. 4 except that the first layer that is a surface layer is formed of a piezoelectric layer 48 having not through-hole. In the second layer to the 25th layer except for the first layer, the piezoelectric layers 22 and the piezoelectric layers 23 are alternately disposed one by one. Since the 25th layer is a final layer, and no layer that is rendered conductive exists below the 25th layer, no through-hole is formed in the 25th layer.

Then, the stacked piezoelectric element 41 exposes the cross section of the through holes from the outer peripheral surface except for the first layer and the 25th layer. All of other forms, driving method, manufacturing method and so on are identical with those in the third embodiment.

Figure 7:
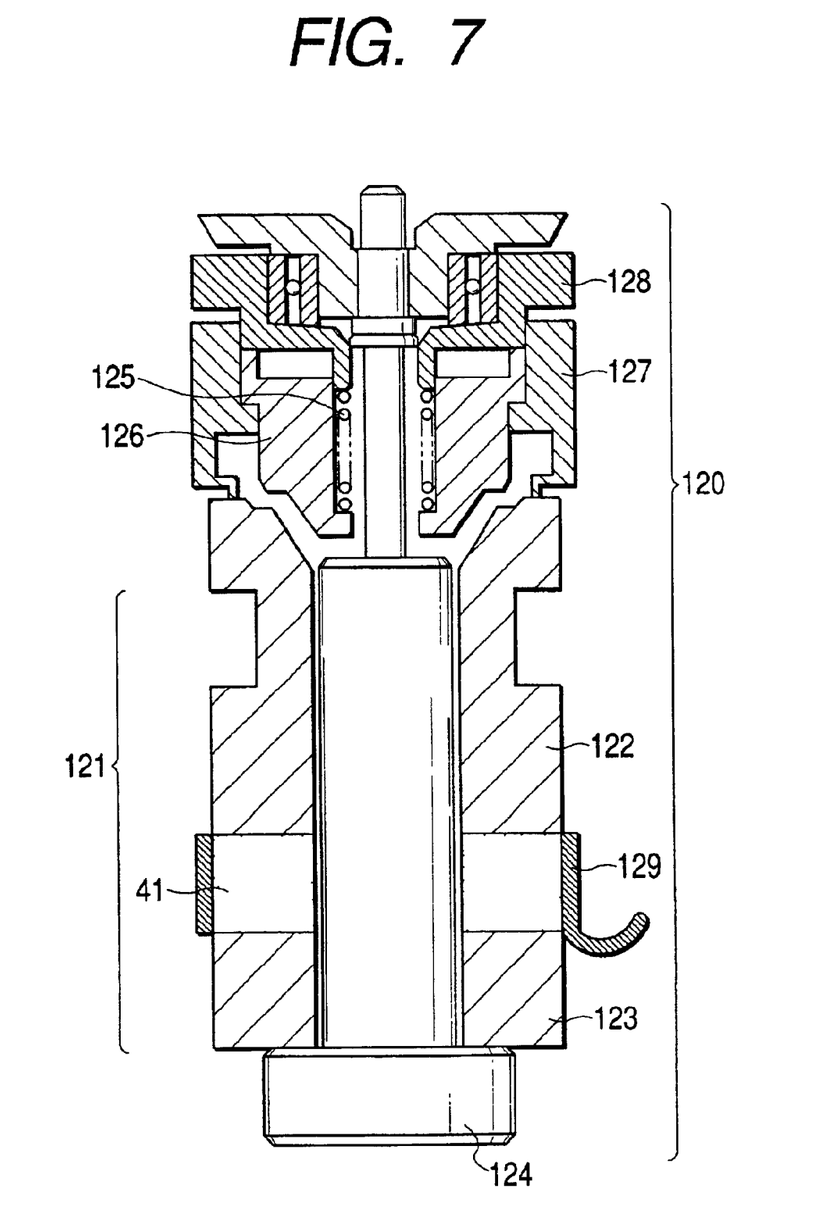
FIG. 7 is a cross-sectional view showing a vibration wave motor in which the stacked piezoelectric element shown in FIG. 6 is incorporated.

FIG. 7 is a diagram showing a structure in which the stacked piezoelectric element 41 shown in FIG. 6 is incorporated in the vibration member 121 that constitutes the bar-shaped vibration wave motor 120. The stacked piezoelectric element 41 is disposed between the metal parts 122 and 123 which are elastic members of the vibration member and fitted by fastening a bolt 124. The rotor 127 is in pressure contact with the metal part 122 through the spring 125 and spring support member 126.

The cross-sections of linear through-holes 46 are exposed from the outer peripheral portion of the stacked piezoelectric element 41. For that reason, unlike that shown in FIG. 3, the wiring substrate 129 is wound around the stacked piezoelectric element 41, and conduction between the external power source and the stacked piezoelectric element 41 are made by the exposed through-holes 46.

Since the wiring substrate is made of normal polyimide resin, the vibration attenuation is large. For that reason, as compared with the structure in which the wiring substrates 109 and 119 are held between the metal parts 102 and 103 which are elastic members as shown in FIG. 3, a structure in which the wiring substrate 129 is not held between the metal parts 122 and 123 that are elastic members as shown in FIG. 7 is very useful particularly in downsizing the vibration wave motor.

In this example, it is unnecessary to expose the through-holes from all of the layers of the stacked piezoelectric element 41 when the conduction between the wiring substrate 129 and the stacked piezoelectric element 41 is taken, but if there is one layer from which the cross sections of the through-holes are exposed, the stacked piezoelectric element 41 and the external power supply can be rendered conductive.

Alternatively, positions at which the through-holes are exposed to the outer peripheral portion may be different for each of the through-holes. In this case, because an interval of a joint portion of the stacked piezoelectric element 41 and the wiring substrate 129 becomes large, the electrode pattern is readily designed.

Figure 8:
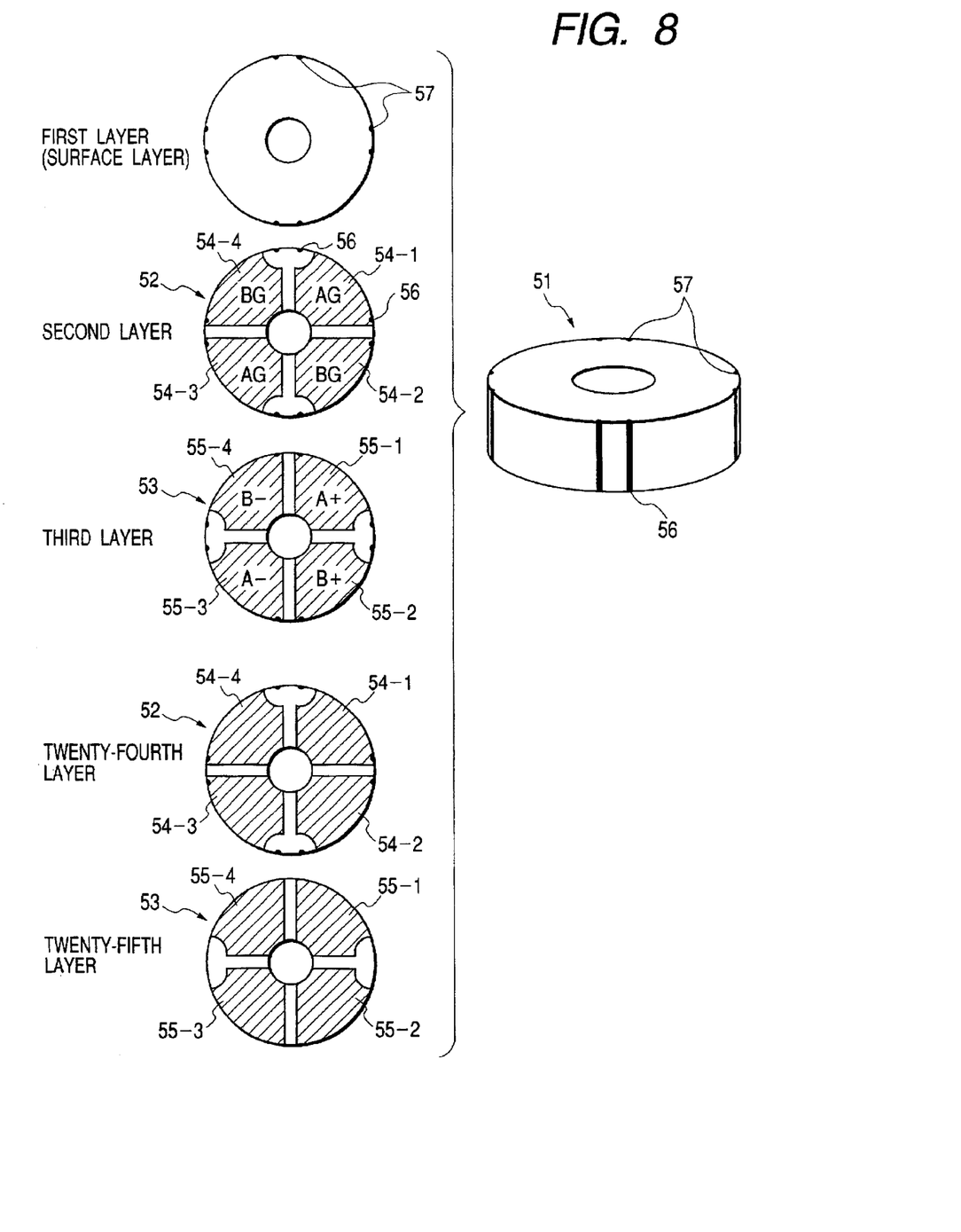
FIG. 8 is a perspective view and an exploded view showing a stacked piezoelectric element in accordance with a sixth embodiment of the present invention.

FIG. 8 shows a sixth embodiment of the present invention.

A stacked piezoelectric element 51 according to this embodiment is identical with the stacked piezoelectric element 21 according to the third embodiment shown in FIG. 4 in appearance.

The stacked piezoelectric element 51 according to this embodiment is different from the stacked piezoelectric element 21 shown in FIG. 4 in the configuration of the through-hole. When manufacturing the stacked piezoelectric element 21 shown in FIG. 4, the through-holes 26 shaped in a circle of 0.35 mm in diameter are formed. If the diameter of the through-holes is larger than that value, because the electrode material filled in the through-holes increase, the costs increases, and there is a tendency that clacks are liable to occur.

Figure 9B:
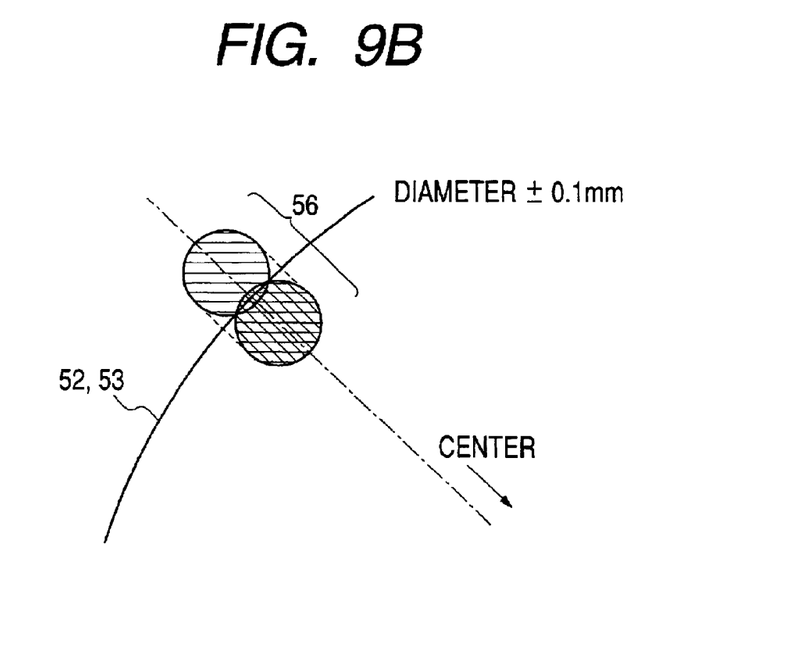

Under the above circumstance, in this embodiment, two through-holes 56 small in diameter shown in FIG. 9B are aligned and formed in the stacked piezoelectric element that has not yet been sintered in the radial direction of the stacked piezoelectric element. Those two through-holes 56 aligned in the radial direction are slightly overlapped on each other. Those two through-holes 56 are so formed as to have the respective centers at a regular distance outward and inward in the radial direction through the outer diameter end of the piezoelectric layer 52 or 53 that has been completed.

Those two through-holes 56 are aligned and formed so as to have a slightly overlapped portion along the radial direction, and thereafter sintered. Then, the electrode material filled in the stacked piezoelectric element and the piezoelectric layer per se are contracted, with the result that each of the through-holes is shaped in a substantially oval that extends in the radial direction.

In this embodiment, the diameter of each of the through-holes is set to 0.2 mm.

Since each of the through-holes is thus shaped in a substantially oval having a longitudinal axis in the radial direction, even if the positional precision of the through-holes in the manufacture is slightly deteriorated, the through-holes can be formed on the outer diameter end portion and the inner diameter end portion. All of other forms, manufacturing method, driving method and so on are identical with those in the third embodiment.

It is needless to say that the through-hole forming method can be applied to the through-holes of the stacked piezoelectric element 21 shown in FIG. 4, the through-holes of the stacked piezoelectric element 31 shown in FIG. 5, or the through-holes of the stacked piezoelectric element 41 shown in FIG. 6.

The stacked piezoelectric elements 21, 31 and 51 in FIGS. 4, 5 and 8 can be incorporated in the bar-shaped vibration wave motor shown in FIG. 3. Any one of the stacked piezoelectric elements 21, 31 and 51 and a wiring substrate are disposed between the metal parts 102 and 103 which are elastic members of the vibration member, and then fitted by fastening a bolt 104. The wiring substrate comes in close contact with the stacked piezoelectric element 21, 31 and 51 by a nipping force exerted at this time. The rotor 107 comes in pressure contact with the metal part 102 through the spring 105 and the spring support member 106.

The stacked piezoelectric element 21, 31, 41 or 51 shown in FIG. 4, 5, 6 or 8 reduces an area of the insulating portion in the periphery of each of the through-holes and can enlarge the area of the inner electrode as compared with the stacked piezoelectric elements 1 and 11 shown in FIGS. 1 and 2. With such structures, the area of the piezoelectric active portion of the stacked piezoelectric element can be increased more than the conventional one.

As a result, the rotation speed of the vibration wave motor, the rotating torque or the drive efficiency can be improved. That is, the vibration wave motor can be more downsized with the similar level in performance.

Also, the through-holes that are exposed to the outer peripheral portion are also effective as positioning marks in the circumferential direction of the stacked piezoelectric element when the vibration wave motor is incorporated.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application enables one skilled in the art to utilize the invention in various embodiments and with various modifications as are suited to the particular use contemplated. It is intended that the scope of the invention be defined by the claims appended hereto, and their equivalents.

What is claimed is:

1. A stacked electro-mechanical energy conversion element, comprising:
   a plurality of layers having a circular shape each of which is formed of a material having an electro-mechanical energy conversion function and has a through-hole in the center thereof;
   a plurality of electrode portions formed at least on one surface of the layers and spaced from each other by a plurality of first non-electrode portions;
   a plurality of wiring conductors which penetrate said plurality of layers and electrically connect electrode portions of the different layers; and
   a plurality of second non-electrode portions formed in the periphery of said wiring conductors so as to prevent said wiring conductors from being rendered conductive to said electrode portions;
   wherein said wiring conductors are formed at least on or in the vicinity of an edge of an outer diameter of each layer, and said electrode portions are formed over the edge of the outer diameter except for portions at which said second non-electrode portions are formed.

2. A stacked electro-mechanical energy conversion element according to claim 1, wherein at least parts of said wiring conductors are exposed to the outer periphery of said stacked piezoelectric element.

3. A stacked electro-mechanical energy conversion element according to claim 2, wherein said wiring conductors are formed on layers other than both end layers.

4. A stacked electro-mechanical energy conversion element according to claim 2, wherein said exposed wiring conductors are connectable to an external terminal.

5. A stacked electro-mechanical energy conversion element according to claim 1, wherein said wiring conductors are positioned substantially at the center of said second non-electrode portions.

6. A stacked electro-mechanical energy conversion element, comprising:
   a plurality of layers having a circular shape each of which is formed of a material having an electro-mechanical energy conversion function and has a through-hole in the center thereof;
   a plurality of electrode portions formed at least on one surface of the layers and spaced from each other by a plurality of first non-electrode portions;
   a plurality of wiring conductors that penetrate said plurality of layers and electrically connect electrode portions of the different layers; and
   a plurality of second non-electrode portions formed in the periphery of said wiring conductors so as to prevent said wiring conductors from being rendered conductive to said electrode portions;
   wherein said wiring conductors are formed at least on or in the vicinity of an edge of an inner diameter of each layer, and said electrode portions are formed over the edge of the inner diameter except for portions at which said second non-electrode portions are formed.

7. A stacked electro-mechanical energy conversion element according to claim 6, wherein at least parts of said wiring conductors are exposed to the inner periphery of said stacked piezoelectric element.

8. A stacked electro-mechanical energy conversion element according to claim 6, wherein said wiring conductors are positioned substantially at the center of said second non-electrode portions.

9. A stacked electro-mechanical energy conversion element, comprising:
   a plurality of layers each of which is formed of a material having an electro-mechanical energy conversion function;
   a plurality of electrode portions formed at least on one surface of the layers and spaced from each other by a plurality of first non-electrode portions;
   a plurality of wiring conductors which penetrate said plurality of layers and electrically connect electrode portions of the different layers; and
   a plurality of second non-electrode portions formed in the periphery of said wiring conductors so as to prevent said wiring conductors from being rendered conductive to said electrode portions;
   wherein said wiring conductors are formed at least on or in the vicinity of an edge of each layer, and said electrode portions are formed over the edge except for portions at which said second non-electrode portions are formed.

10. A stacked electro-mechanical energy conversion element according to claim 9, wherein at least a part of said wiring conductors are exposed to the outer periphery of said stacked piezoelectric element.

11. A stacked electro-mechanical energy conversion element according to claim 10, wherein said wiring conductors are formed on layers other than both end layers.

12. A stacked electro-mechanical energy conversion element according to claim 10, wherein said exposed wiring conductors are connectable to an external terminal.

13. A stacked electro-mechanical energy conversion element according to claim 9, wherein said wiring conductors are positioned substantially at the center of said second non-electrode portions.

* * * * *